(12) United States Patent
De Silva et al.

(10) Patent No.: US 11,037,786 B2
(45) Date of Patent: Jun. 15, 2021

(54) PATTERNING MATERIAL FILM STACK WITH METAL-CONTAINING TOP COAT FOR ENHANCED SENSITIVITY IN EXTREME ULTRAVIOLET (EUV) LITHOGRAPHY

(71) Applicant: International Business Machines Corporation, Armonk, NY (US)

(72) Inventors: Ekmini Anuja De Silva, Slingerlands, NY (US); Dario Goldfarb, Dobbs Ferry, NY (US); Nelson Felix, Slingerlands, NY (US); Daniel Corliss, Waterford, NY (US); Rudy J. Wojtecki, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/404,404

(22) Filed: May 6, 2019

(65) Prior Publication Data

US 2019/0259601 A1 Aug. 22, 2019

Related U.S. Application Data

(62) Division of application No. 15/846,942, filed on Dec. 19, 2017, now Pat. No. 10,347,486.

(51) Int. Cl.
*H01L 21/027* (2006.01)
*H01L 21/033* (2006.01)
(Continued)

(52) U.S. Cl.
CPC .......... *H01L 21/0274* (2013.01); *G03F 7/091* (2013.01); *G03F 7/094* (2013.01);
(Continued)

(58) Field of Classification Search
CPC ............ H01L 21/0274; H01L 21/0273; H01L 21/32139; H01L 21/3081; H01L 21/0335;
(Continued)

(56) References Cited

U.S. PATENT DOCUMENTS 5,516,886 A 5/1996 Rahman et al.
5,739,575 A 4/1998 Numano et al.
(Continued)

FOREIGN PATENT DOCUMENTS

CN 101303459 A 11/2008
WO PCT/IB2018/059600 3/2019

OTHER PUBLICATIONS

D. De Simone et al., "Progresses and Challenges of EUV Lithography Materials," Journal of Photopolymer Science Technology (SPST), Apr. 30, 2014, pp. 601-610, vol. 27, No. 5.
(Continued)

*Primary Examiner* — Patricia D Reddington
(74) *Attorney, Agent, or Firm* — Abdy Raissinia; Ryan, Mason & Lewis, LLP

(57) ABSTRACT

A semiconductor structure includes a semiconductor substrate and a multi-layer patterning material film stack formed on the semiconductor substrate. The patterning material film stack includes a resist layer formed over one or more additional layers. The semiconductor structure further includes a metal-containing top coat formed over the resist layer. The metal-containing top coat can be formed, for example, by atomic layer deposition or spin-on deposition over the resist layer, or by self-segregation from the resist layer.

16 Claims, 3 Drawing Sheets

(51) Int. Cl.
  *G03F 7/26* (2006.01)
  *G03F 7/20* (2006.01)
  *G03F 7/09* (2006.01)
  *H01L 21/3213* (2006.01)
  *H01L 21/308* (2006.01)
  *G03F 7/11* (2006.01)
  *H01L 43/12* (2006.01)

(52) U.S. Cl.
  CPC .............. *G03F 7/2004* (2013.01); *G03F 7/26* (2013.01); *H01L 21/0273* (2013.01); *H01L 21/0335* (2013.01); *H01L 21/0337* (2013.01); *H01L 21/3081* (2013.01); *H01L 21/32139* (2013.01); *G03F 7/092* (2013.01); *G03F 7/11* (2013.01); *H01L 21/0332* (2013.01); *H01L 43/12* (2013.01)

(58) Field of Classification Search
  CPC . H01L 21/0337; H01L 21/0332; G03F 7/091; G03F 7/26; G03F 7/2004; G03F 7/094; G03F 7/11
  See application file for complete search history.

(56) References Cited

U.S. PATENT DOCUMENTS

| | | | |
|---|---|---|---|
| 7,456,932 B2 | 11/2008 | Bakker et al. | |
| 7,473,512 B2 | 1/2009 | Houlihan et al. | |
| 7,960,096 B2 | 6/2011 | Abraham et al. | |
| 8,083,958 B2 | 12/2011 | Li et al. | |
| 8,257,910 B1 | 9/2012 | Guerrero et al. | |
| 8,968,989 B2 | 3/2015 | Ouattara et al. | |
| 9,711,447 B1 | 7/2017 | Shu et al. | |
| 2002/0076626 A1 | 6/2002 | Montgomery et al. | |
| 2004/0265706 A1* | 12/2004 | Montgomery | G03F 7/093 430/5 |
| 2005/0183348 A1 | 8/2005 | Kuhn et al. | |
| 2007/0231751 A1 | 10/2007 | Bristol et al. | |
| 2008/0286883 A1 | 11/2008 | Shiraiwa et al. | |
| 2009/0212016 A1 | 8/2009 | Cheng et al. | |
| 2014/0378592 A1 | 12/2014 | Trefonas, III et al. | |
| 2016/0109804 A1 | 4/2016 | Huli | |
| 2017/0168398 A1 | 6/2017 | Zi et al. | |
| 2017/0233532 A1 | 8/2017 | Arellano et al. | |
| 2018/0031964 A1* | 2/2018 | Jindal | G03F 1/60 |
| 2018/0096884 A1* | 4/2018 | Shank | H01L 21/84 |
| 2018/0122737 A1 | 5/2018 | van Kervinck et al. | |

OTHER PUBLICATIONS

M. Toriumi et al., "Metal Resist for Extreme Ultraviolet Lithography Characterized by Scanning Transmission Electron Microscopy," The Japan Society of Applied Physics, Applied Physics Express, Jan. 29, 2016, 4 pages, vol. 9, No. 3.

K. Du et al., "Embedded Barrier Layer for Reducing the Effect Out of Band Radiation in EUV Lithography," Advances in Patterning Materials and Processes XXXIV, Proceedings of SPIE, Mar. 27, 2017, 7 pages, vol. 10146.

List of IBM Patents or Patent Applications Treated as Related.

* cited by examiner

PATTERNING MATERIAL FILM STACK WITH METAL-CONTAINING TOP COAT FOR ENHANCED SENSITIVITY IN EXTREME ULTRAVIOLET (EUV) LITHOGRAPHY

BACKGROUND

The present application relates to manufacturing of semiconductor integrated circuits, and more particularly to patterning of semiconductor integrated circuit features using lithography processes. As part of the ongoing world-wide effort to shrink integrated circuit device dimensions, a variety of single-pattern and multiple-pattern lithography processes based on deep ultraviolet (DUV) radiation wavelengths such as 193 nanometers (193 nm) have come into widespread use, although further extension of such arrangements to the patterning of features at production nodes below 10 nm may be problematic. Recent development of extreme ultraviolet (EUV) lithography processes using wavelengths such as 13.5 nm are expected to facilitate the accurate patterning of features at sub-10 nm production nodes, but there remain significant difficulties in the practical implementation of EUV processes. For example, EUV radiation source output power is limited, necessitating lengthy wafer exposure times. It would be highly desirable to provide a mechanism for alleviating such drawbacks.

SUMMARY

Illustrative embodiments of the invention provide a metal-containing top coat for use with a patterning material film stack in an EUV lithography process. Such arrangements can significantly increase the EUV sensitivity of a patterning material film stack so as to reduce required wafer exposure times and/or power requirements of EUV radiation sources. This can in turn lead to substantially increased wafer throughput rates and corresponding reductions in integrated circuit manufacturing costs.

In one embodiment, a lithographic patterning method comprises forming a multi-layer patterning material film stack on a semiconductor substrate, the patterning material film stack comprising a resist layer formed over one or more additional layers, and forming a metal-containing top coat over the resist layer. The method further comprises exposing the multi-layer patterning material film stack to patterning radiation through the metal-containing top coat to form a desired pattern in the resist layer, removing the metal-containing top coat, developing the pattern formed in the resist layer, etching at least one underlying layer in accordance with the developed pattern, and removing remaining portions of the resist layer. The metal-containing top coat can be formed, for example, by atomic layer deposition or spin-on deposition over the resist layer, or by self-segregation from the resist layer.

In another embodiment, a semiconductor structure comprises a semiconductor substrate, and a multi-layer patterning material film stack formed on the semiconductor substrate, with the patterning material film stack comprising a resist layer formed over one or more additional layers, such as a hard mask layer and an organic planarizing layer. The semiconductor structure further comprises a metal-containing top coat formed over the resist layer. The metal-containing top coat illustratively comprises at least one of a transition metal and a post-transition metal, possibly in the form of one or more metal oxides. The metal-containing top coat may also comprise one or more metalloids. The metal-containing top coat in some embodiments is illustratively configured so as to be soluble in a developer solution or other fluid used in developing a pattern formed in the resist layer.

In a further embodiment, a metal-containing material is configured to form a metal-containing top coat over a resist layer of a multi-layer patterning material film stack formed on a semiconductor substrate. The patterning material film stack comprises the resist layer and one or more additional layers over which the resist layer is formed. The metal-containing material is configured to form the metal-containing top coat by one of deposition over the resist layer and self-segregation from the resist layer. The metal-containing material illustratively comprises at least one of a transition metal and a post-transition metal, possibly in the form of one or more metal oxides. The metal-containing material may also comprise one or more metalloids. The metal-containing material in some embodiments comprises a self-segregating fluorine functionalized metal additive configured for inclusion in a resist mixture used to form the resist layer.

DETAILED DESCRIPTION

Illustrative embodiments are described herein in the context of EUV lithography processes and associated patterning material film stacks and metal-containing top coats. However, it is to be understood that embodiments of the invention are not limited to these illustrative arrangements, but are instead more broadly applicable to a wide variety of different lithography processes, patterning material film stacks, metal-containing top coats and other features and functionality. For example, other embodiments are not limited to use with any particular single-pattern or multiple-pattern EUV lithography process but can be applied to a wide variety of other types of lithography processes, including both single-pattern and multiple-pattern DUV lithography processes. Also, the particular arrangements of layers utilized within the patterning material film stack can be varied in other embodiments. Moreover, the particular components of the metal-containing top coat and its manner of formation can be varied in other embodiments. These and numerous other variations in the disclosed arrangements will be apparent to those skilled in the art.

Illustrative embodiments involve forming a metal-containing top coat over a resist layer of a multi-layer patterning material stack in order to increase the EUV sensitivity of the patterning material film stack in an EUV lithography process. The metal-containing top coat can be formed by deposition over the resist layer, by self-segregation from the resist layer, or using other techniques, including a combination of deposition and self-segregation techniques. By providing increased EUV sensitivity in the patterning material film stack, illustrative embodiments can reduce required wafer exposure times and/or power requirements of EUV radiation sources. This can in turn lead to substantially increased wafer throughput rates and corresponding reductions in integrated circuit manufacturing costs.

FIGS. 1 through 8 show a portion of an EUV lithography process involving the formation of a metal-containing top coat over a resist layer of a patterning material film stack in an illustrative embodiment. The EUV lithography process is applied to a semiconductor wafer in conjunction with the manufacture of integrated circuits. The figures illustrate respective cross-sectional views of a portion of the semiconductor wafer as it undergoes sequential processing operations as part of the EUV lithography process. It is to be appreciated that the various elements and other features shown in these figures are simplified for clarity and simplicity of illustration and are not necessarily drawn to scale.

It should also be noted that references herein to formation of one layer or structure "on" or "over" another layer or structure are intended to be broadly construed, and should not be interpreted as precluding the presence of one or more intervening layers or structures.

Figure 1:
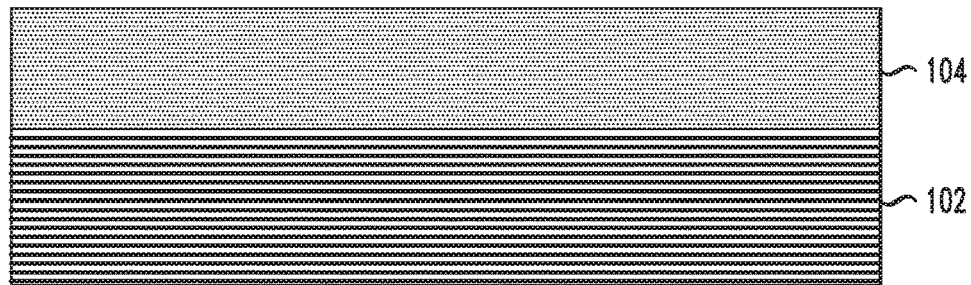
FIG. 1 shows a cross-sectional view of a semiconductor structure following formation of an organic planarizing layer on a semiconductor substrate in an illustrative embodiment.

Referring initially to FIG. 1, a semiconductor structure 100 represents a portion of a semiconductor wafer having a semiconductor substrate 102. At least portions of the semiconductor substrate 102 may be formed of silicon (Si), and may have a thickness of about 500 to 1000 micrometers ($\mu$m). The semiconductor substrate 102 may itself comprise multiple layers, although it is shown as a single layer in the figure, again for clarity and simplicity of illustration. The semiconductor structure 100 further comprises an organic planarizing layer (OPL) 104. The OPL 104 in some embodiments is formed to a thickness of approximately 60 nm, although these and other dimensions are presented herein as illustrative examples and should not be construed as limiting. The OPL 104 in the present embodiment is a lower-most layer of what is referred to herein as a "multi-layer patterning material film stack," although such a film stack in other embodiments need not include OPL 104.

Figure 2:
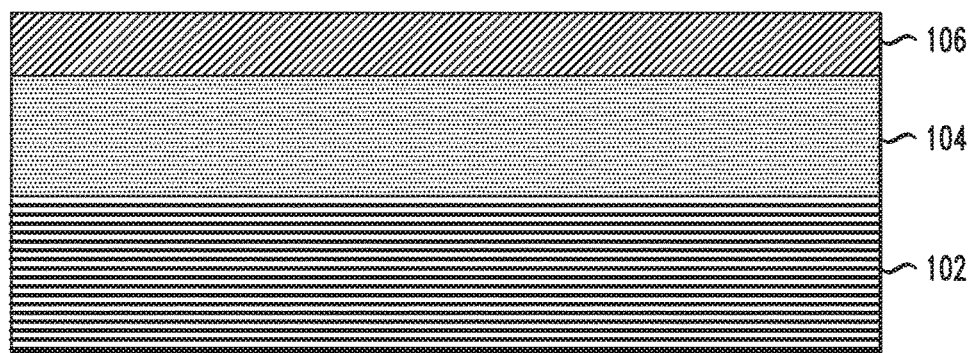
FIG. 2 shows a cross-sectional view of a semiconductor structure following formation of a hard mask layer over an organic planarizing layer in an illustrative embodiment.

As shown in FIG. 2, a hard mask layer 106 is formed over the OPL 104, resulting in the semiconductor structure 200. The hard mask layer 106 is illustratively formed of silicon-based materials such as silicon oxide, silicon nitride or silicon oxynitride, although a wide variety of other inorganic or organic materials could be used. Additional examples of inorganic materials that may be used to form the hard mask layer 106 include metal-containing materials such as titanium oxide or titanium nitride. Numerous other metal oxides, metal nitrides and/or metal oxynitrides, as well as other types of metal-containing materials, could be used. The hard mask layer 106 in this embodiment is a second layer of the multi-layer patterning material film stack, overlying the OPL 104. The hard mask layer 106 may have a thickness in the range of about 3 nm to 15 nm.

Figure 3:
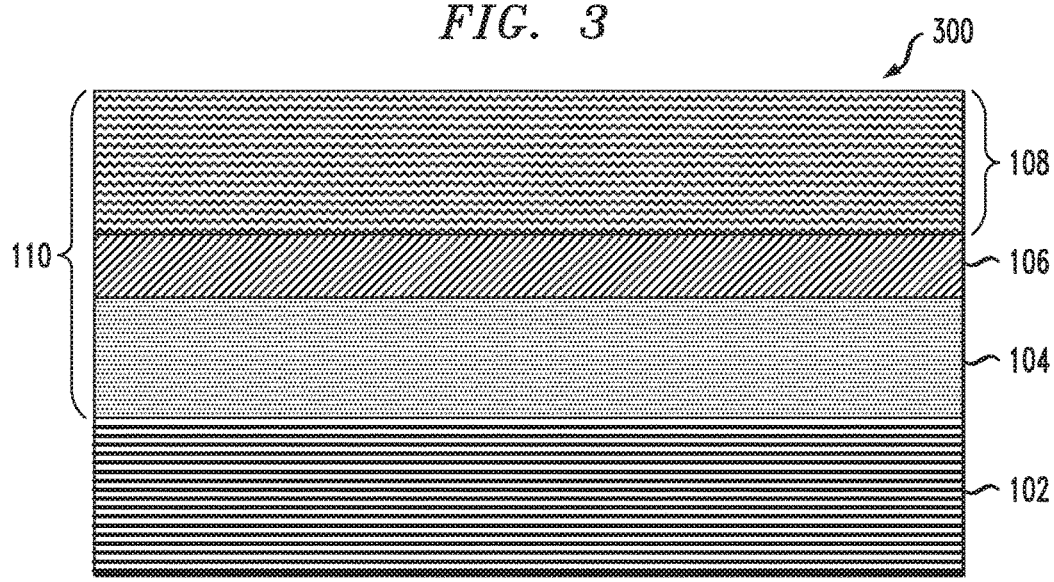
FIG. 3 shows a cross-sectional view of a semiconductor structure following formation of a resist layer over a hard mask layer in an illustrative embodiment.

Turning now to FIG. 3, a resist layer 108 is formed over the hard mask layer 106, resulting in the semiconductor structure 300. This structure 300 includes a multi-layer patterning material film stack 110 that includes the OPL 104, the hard mask layer 106 and the resist layer 108. The resist layer comprises a photosensitive material suitable for patterning using a EUV radiation source and a corresponding photomask. The resist layer 108 illustratively comprises an organic EUV photoresist, and more particularly an organic chemically-amplified photoresist, although other types of resist materials can be used. The resist layer 108 may have a thickness in the range of about 10 nm to 30 nm.

In other embodiments, the multi-layer patterning material film stack 110 can include additional or alternative layers underlying the resist layer 108. Accordingly, the particular multi-layer patterning material film stack 110 shown in the figure is presented by way of illustrative example only. A given such film stack will generally comprise a resist layer formed over one or more additional layers. The one or more additional layers in the present example comprise the OPL 104 and the hard mask layer 106.

Figure 4:
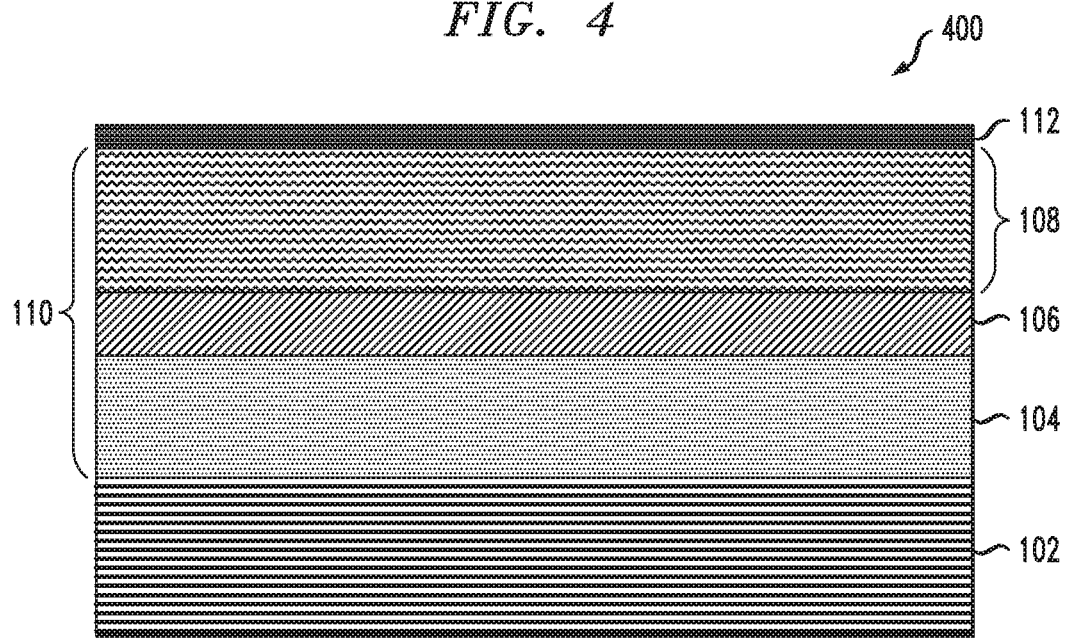
FIG. 4 shows a cross-sectional view of a semiconductor structure following formation of a metal-containing top coat over a resist layer in an illustrative embodiment.

As illustrated in FIG. 4, a metal-containing top coat 112 is formed over the resist layer 108 of the multi-layer patterning material film stack 110, resulting in the semiconductor structure 400. In some embodiments, the metal-containing top coat over the resist layer is formed using a deposition process, such as an atomic layer deposition (ALD) process or a spin-on deposition process. The metal-containing top coat 112 is illustratively formed as a relatively thin layer so as to avoid any danger of pattern collapse due to high aspect ratios.

For example, an ALD process may be used to deposit the metal-containing top coat to a thickness of about 2 nm to 5 nm. Such an ALD process illustratively utilizes low temperature deposition conditions. In some embodiments, this involves utilization of a deposition temperature that is less than the temperature of a post-application bake (PAB) process applied to the resist layer 108. For example, the temperature of the PAB process for the resist layer 108 may be 150° C., and in such an embodiment the deposition temperature used in the ALD process to form the metal-containing top coat 112 would be substantially less than 150° C. For example, low temperature deposition at 50° C. may be used. These and other low temperature deposition processes allow coating on a variety of different resist materials, and facilitate formation of tailorable coating thicknesses at the surface of the resist layer 108.

The term "metal-containing top coat" as used herein is intended to be broadly construed so as to encompass various coatings or other types of layers or arrangements of multiple layers that can be formed over a resist layer as part of a lithographic patterning process.

As indicated above, spin-on deposition processes may also be used to form the metal-containing top coat 112. For example, a spin-on deposition process can be used to form the metal-containing top coat 112 as a spin coat of metal oxide nanoparticles after a PAB process is applied to the resist layer 108.

In some embodiments, the metal-containing top coat 112 can be formed using processes similar to those used in forming a bottom anti-reflective coating (BARC) in EUV lithography. Such BARC processes are commonly used to form thin film coatings with high uniformity. Other examples of deposition processes that may be used to form the metal-containing top coat 112 in illustrative embodiments include chemical vapor deposition (CVD) and physical vapor deposition (PVD).

Techniques other than deposition can be used to form the metal-containing top coat 112. For example, the metal-containing top coat 112 in semiconductor structure 400 of FIG. 4 can be formed over the resist layer 108 utilizing a process of self-segregation from the resist layer 108. In an arrangement of this type, a self-segregating material is provided in a resist mixture used to form the resist layer 108. The resist mixture is used to form the resist layer 108, and the resist layer 108 is then subjected to a designated process to cause the self-segregating material to self-segregate from the resist layer to form the metal-containing top coat 112. For example, the self-segregating material may comprise a fluorine functionalized metal additive. The designated process that causes the self-segregating material to self-segregate from the resist layer 108 to form the metal-containing top coat 112 illustratively comprises a PAB process.

A self-segregating material incorporated into a resist mixture to form the metal-containing top coat 112 by self-segregation is considered an illustrative embodiment of the invention, as is a resist mixture containing such a self-segregating material.

Examples of self-segregating materials that can be used to form the metal-containing top coat by self-segregation include additive materials with fluoroalcohol functionality that can be incorporated into a resist mixture, as well as pendant metal group or metal backbone based polymers.

The metal-containing top coat 112 illustratively comprises metal compositions containing at least one of a transition metal and a post-transition metal. For example, the metal-containing top coat in some embodiments comprises at least one transition metal, such as at least one of hafnium (Hf), zirconium (Zr), tantalum (Ta), tungsten (W), chromium (Cr), cobalt (Co), iron (Fe) and platinum (Pt). Additionally or alternatively, the metal-containing top coat 112 comprises at least one post-transition metal such as tin (Sn). In some embodiments, the metal-containing top coat 112 also incorporates at least one metalloid, such as antimony (Sb).

The above-noted metals and metalloids are examples of what are more generally referred to herein as "high-Z" atoms, where Z denotes the atomic number of the atom, and alternative high-Z atoms can be used in metal-containing top coat 112 in other embodiments.

The metal compositions used in the metal-containing top coat 112 are illustratively in the form of metal oxides, at a concentration of less than about 30% of the metal-containing top coat 112. For example, the metal-containing top coat 112 can be formed by low temperature deposition of tin oxide (SnOx) at 50° C. The concentration percentage amount in this context and other similar contexts herein refers to mole percent (mol %).

Examples of compositions that may be used to form the metal-containing top layer 112 by self-segregation from resist layer 108 in illustrative embodiments include copolymers with hexafluoroacetone (HFA), and tin (Sn) containing monomer units or other types of metal-containing monomer units.

As a more particular example, a copolymer with HFA suitable for use in forming the metal-containing top coat 112 has the following chemical formula, where R denotes hydrogen (H) or a methyl or alkyl group:

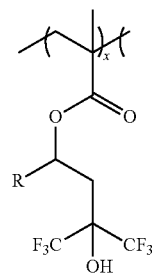

In the above example, X denotes the number of units. For a typical polymer combined with metal units, HFA and possibly one or more other units, the percentage of HFA would be about 5% to 15% in order to support self-segregation of the metal-containing top coat 112 from the resist layer 108, with the percentage amounts again referring to mole percent (mol %).

As another example, a tin (Sn) containing monomer unit suitable for use in forming the metal-containing top coat 112 has the following chemical formula:

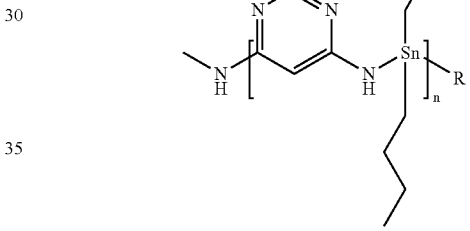

In this example, n denotes the number of units present, and R denotes an alkyl group.

Again, the above material formulations are examples only, and a wide variety of other materials having different chemical compositions can be used, including other copolymers with HFA, other metal-containing monomer units, and other types of compositions, in forming the metal-containing top coat 112.

The metal-containing top coat 112 is configured in some embodiments to increase the EUV sensitivity of the patterning material film stack 110 by increasing generation of secondary electrons in the resist layer 108. The metal-containing top coat 112 in such embodiments enhances the ability of the resist layer 108 to absorb EUV radiation by allowing it to capture more EUV photons during exposure.

For example, the resist material of the resist layer 108 can undergo enhanced sensitivity through selective infiltration of and subsequent reaction with components of the metal-containing top coat 112. As a more particular example, in the case of the above-noted deposited SnOx top coat, SnOx particles may infiltrate into or otherwise become part of the resist layer 108.

These and other embodiments comprising a metal-containing top coat can significantly increase EUV sensitivity without sacrificing patterned feature resolution or adversely impacting patterning quality metrics such as line edge roughness (LER) and line width roughness (LWR).

Figure 5:
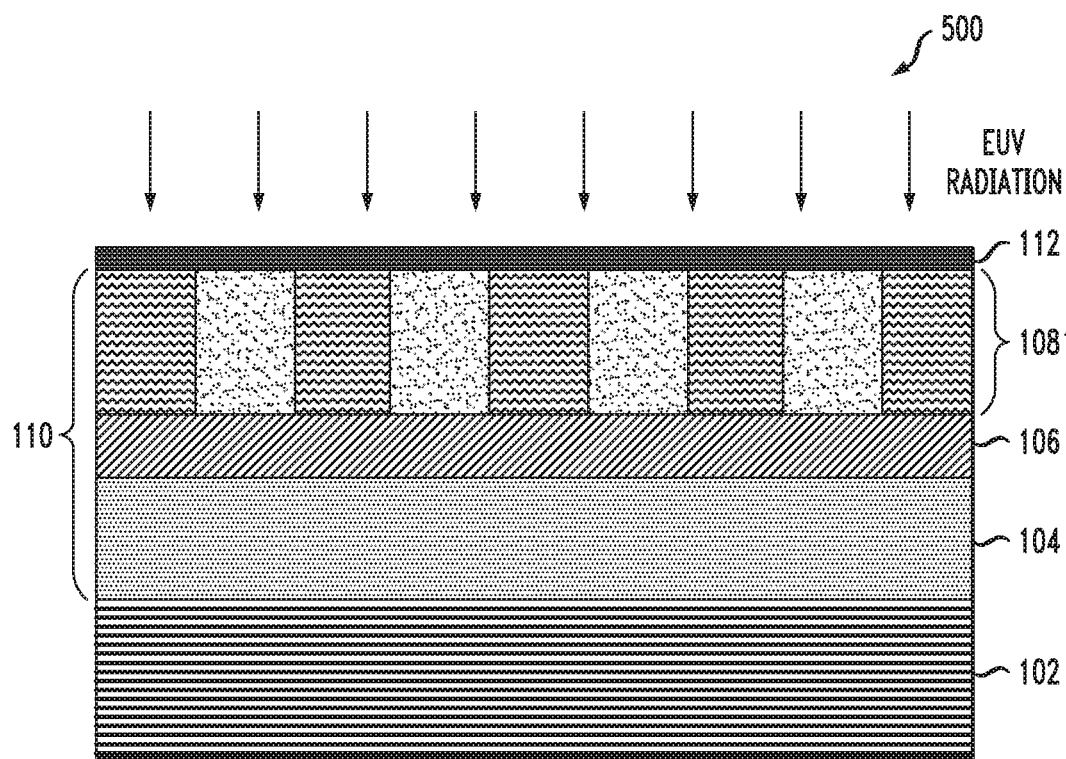
FIG. 5 shows a cross-sectional view of a semiconductor structure under exposure to EUV radiation in conjunction with patterning of a resist layer through a metal-containing top coat in an illustrative embodiment.

Referring now to FIG. 5, the multi-layer patterning material film stack 110 is exposed to EUV patterning radiation through the metal-containing top coat 112 to form a desired pattern in the resist layer 108. The resulting semiconductor structure 500 includes a patterned resist layer denoted by reference numeral 108' in the figure.

Figure 6:
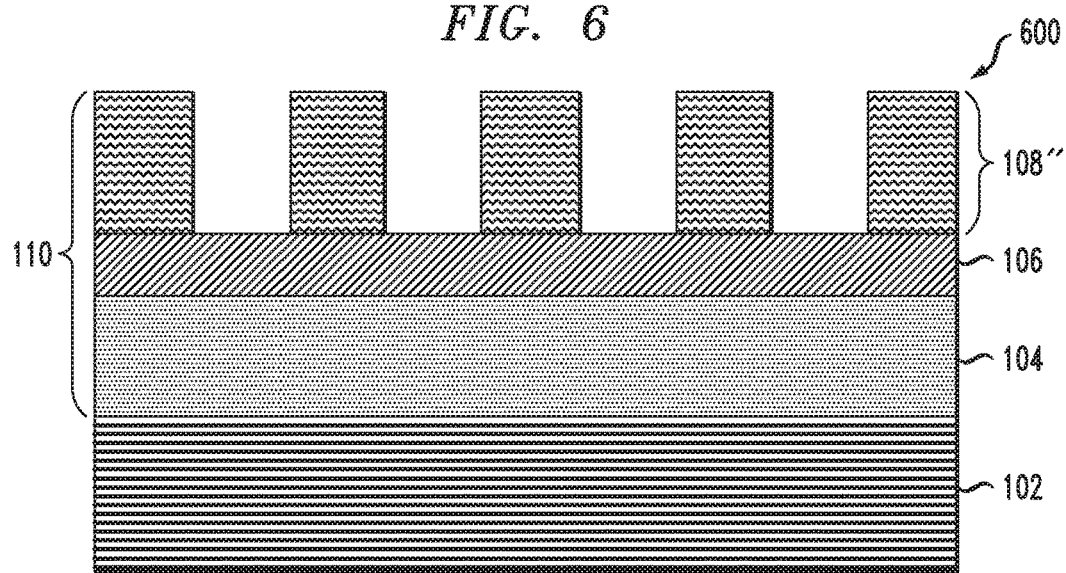
FIG. 6 shows a cross-sectional view of a semiconductor structure following development of a pattern in a resist layer in an illustrative embodiment.

The metal-containing top coat 112 is then removed and the patterned resist layer 108' is developed, resulting in the semiconductor structure 600 as shown in FIG. 6. For example, the metal-containing top coat 112 can be removed by stripping, after which the patterned resist layer 108' is developed using a developer solution. Development of the patterned resist layer 108' results in a developed resist layer 108" in which portions of the resist layer are removed in accordance with the pattern.

Alternatively, the metal-containing top coat 112 may be made of a material that is soluble in the developer solution used in developing the pattern formed in the resist layer 108'. For example, the metal-containing top coat 112 can be configured so as to be soluble in a base and/or water during resist development. In an arrangement of this type, the metal-containing top coat 112 is removed as part of the process of developing the pattern formed in the resist layer 108'. Again, development of the patterned resist layer 108' results in a developed resist layer 108" in which portions of the resist layer are removed in accordance with the pattern.

Accordingly, post-exposure the metal-containing top coat 112 can be stripped in a separate step, or if configured to have inherent soluble functionality can be removed as part of the resist development process.

Figure 7:
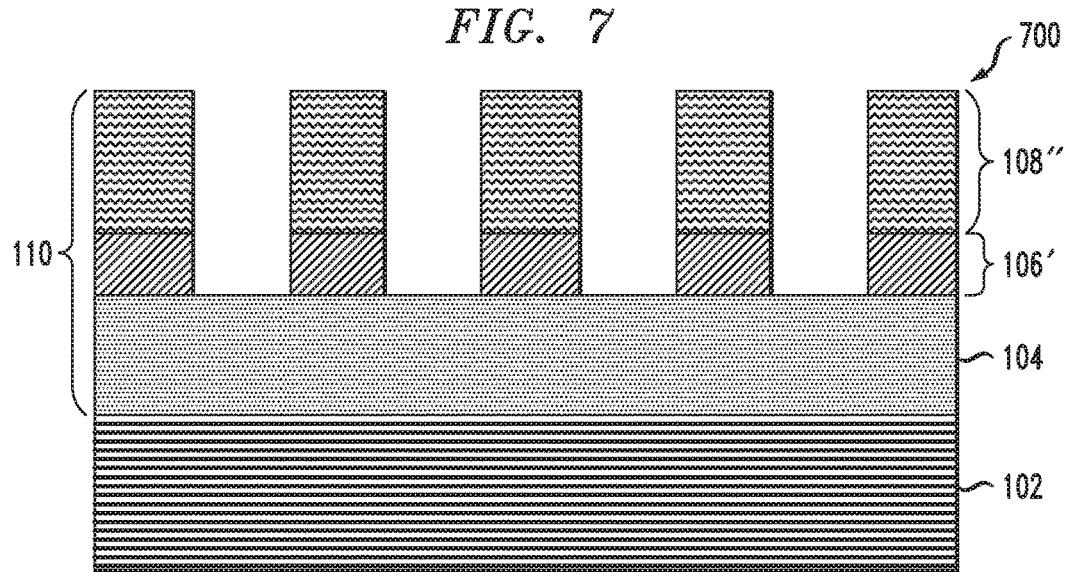
FIG. 7 shows a cross-sectional view of a semiconductor structure following etching of a hard mask layer in accordance with a pattern formed in a resist layer in an illustrative embodiment.

As shown in FIG. 7, the hard mask layer 106 underlying the developed resist layer 108" is etched in accordance with the developed pattern to produce the semiconductor structure 700. This part of the process results in transfer of the pattern from the developed resist layer 108" to patterned hard mask layer 106' as shown. The etching can be performed using a process such as reactive ion etching (RIE) or wet etching.

Figure 8:
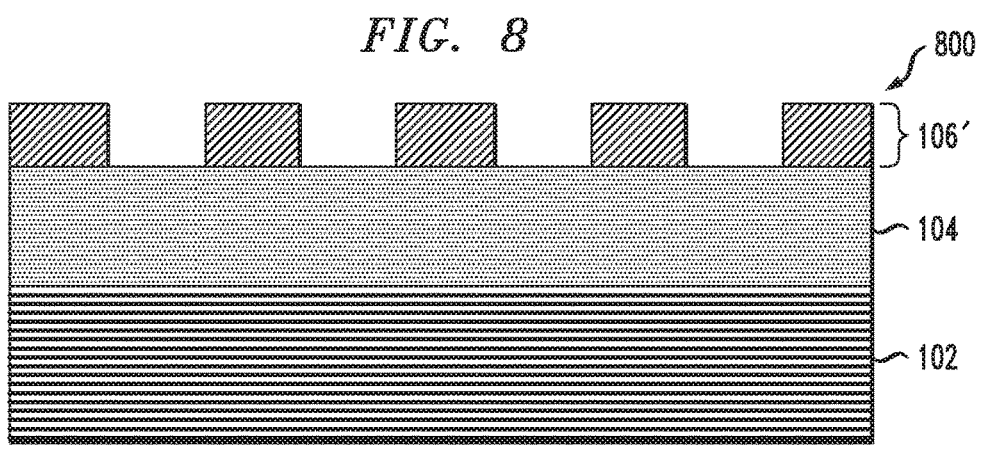
FIG. 8 shows a cross-sectional view of a semiconductor structure showing an etched hard mask layer after removal of remaining portions of a resist layer in an illustrative embodiment.

Remaining portions of the developed resist layer 108" are then removed, as shown in FIG. 8, resulting in the semiconductor structure 800. The semiconductor structure 800 is then subject to additional processing operations of a type well known to those skilled in the art, in order to form desired integrated circuit structures on the semiconductor wafer. For example, portions of the process as previously described in conjunction with FIGS. 1 through 8 can be repeated with different pattern masks in order to further configure the hard mask layer in accordance with additional pattern features.

In other embodiments, other types of multi-layer patterning material film stacks may be used. For example, in some embodiments, the hard mask layer is omitted, and one or more layers of the semiconductor substrate 102 are etched in accordance with the pattern of the developed resist layer 108". These and numerous other lithographic patterning arrangements using a metal-containing top coat formed over a resist layer can be implemented using the techniques disclosed herein, as will be appreciated by those skilled in the art.

Illustrative embodiments can include a semiconductor structure comprising a semiconductor substrate and a multi-layer patterning material film stack formed on the semiconductor substrate, with the patterning material film stack comprising a resist layer formed over one or more additional layers, such as a hard mask layer and an organic planarizing layer. The semiconductor structure further comprises a metal-containing top coat formed over the resist layer. The metal-containing top coat illustratively comprises at least one of a transition metal and a post-transition metal, possibly in the form of one or more metal oxides. The metal-containing top coat may also comprise one or more metalloids. The metal-containing top coat in some embodiments is illustratively configured so as to be soluble in a developer solution used in developing a pattern formed in the resist layer.

Other illustrative embodiments can include a metal-containing material configured to form a metal-containing top coat over a resist layer of a multi-layer patterning material film stack formed on a semiconductor substrate. The patterning material film stack comprises the resist layer and one or more additional layers over which the resist layer is formed. The metal-containing material is configured to form the metal-containing top coat by one of deposition over the resist layer and self-segregation from the resist layer. The metal-containing material illustratively comprises at least one of a transition metal and a post-transition metal, possibly in the form of one or more metal oxides. The metal-containing material may also comprise one or more metalloids. The metal-containing material in some embodiments comprises a self-segregating fluorine functionalized metal additive configured for inclusion in a resist mixture used to form the resist layer.

Further illustrative embodiments can include a multi-layer patterning material film stack comprising a resist layer formed over one or more additional layers, such as a hard mask layer and an organic planarizing layer. A metal-containing top coat is formed over the resist layer, and in some embodiments may be considered part of the multi-layer patterning film stack. The multi-layer patterning material film stack may be formed on a semiconductor substrate or on other types of substrates, layers or materials.

Additional illustrative embodiments include lithography tools and other types of lithographic patterning equipment that are configured to perform lithographic processes such as those described above in conjunction with the manufacture of semiconductor integrated circuits. For example, an EUV lithography tool such as the ASML NXE:3300B or NXE:3350B operating at a wavelength of 13.5 nm can be modified to perform an EUV lithography process of the type described above that includes forming a metal-containing top coat using the techniques disclosed herein. Again, other types of lithography processes and associated lithography tools can be used, based on patterning radiation at DUV wavelengths or other wavelengths, and the techniques disclosed herein are therefore not limited to use with EUV lithography processes or EUV lithography tools.

Examples of integrated circuit structures that can be formed using EUV lithography processes as disclosed herein include nanosheet metal-oxide-semiconductor field-effect transistor (MOSFET) devices. The use of a metal-containing top coat as disclosed herein can facilitate the manufacture of such devices by increasing the EUV sensitivity of the multi-layer patterning material film stack, thereby facilitating the formation of sub-10 nm features. Similar improvements are provided for alternative ranges of feature sizes, such as sub-50 nm features. A wide variety of other types of integrated circuit devices can be fabricated using an EUV lithography process that includes one or more iterations of at least portions of the steps shown in FIGS. 1 through 8.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

It is to be understood that the various layers, structures, and/or regions described above are not necessarily drawn to scale. In addition, for ease of explanation one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described herein for economy of description.

Terms such as "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Also, in the figures, the illustrated scale of one layer, structure, and/or region relative to another layer, structure, and/or region is not necessarily intended to represent actual scale.

Semiconductor devices and methods for forming same in accordance with the above-described techniques can be employed in various applications, hardware, and/or electronic systems, including but not limited to personal computers, communication networks, electronic commerce systems, portable communications devices (e.g., cell and smart phones), solid-state media storage devices, functional circuitry, etc. Given the teachings provided herein, one of ordinary skill in the art will be able to contemplate other implementations and applications of embodiments of the invention.

In some embodiments, the above-described techniques are used in connection with manufacture of semiconductor integrated circuit devices that illustratively comprise, by way of non-limiting example, CMOS devices, MOSFET devices, and/or FinFET devices, and/or other types of semiconductor integrated circuit devices that incorporate or otherwise utilize CMOS, MOSFET, and/or FinFET technology.

Accordingly, at least portions of one or more of the semiconductor structures described herein may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
a semiconductor substrate; and
a resist mixture comprising a resist material and a metal additive, the resist material configured to form a resist layer of a multi-layer patterning material film stack disposed on the semiconductor substrate, the patterning material film stack comprising the resist layer disposed over one or more additional layers, the metal additive adapted to self-segregate to thereby configure a metal-containing top coat disposed over the resist layer.

2. The semiconductor structure of claim 1 wherein the metal-containing top coat comprises at least one of a transition metal and a post-transition metal.

3. The semiconductor structure of claim 1 wherein the metal-containing top coat comprises a metal oxide.

4. The semiconductor structure of claim 1 wherein the metal-containing top coat is soluble in a developer solution used in developing a pattern formed in the resist layer.

5. The semiconductor structure of claim 1 wherein the metal additives are configured and adapted to self-segregate from the resist material when subjected to a designated treatment process.

6. The semiconductor structure of claim 1 wherein the designated treatment process includes a bake process.

7. The semiconductor structure of claim 1 including one or more additional layers of the metal-containing top coat.

8. The semiconductor structure of claim 1 wherein the metal-containing top coat comprises properties enabling solubility in a developer solution used in developing a pattern formed in the resist layer.

9. A metal-containing material configured to form a metal-containing top coat over a resist layer of a multi-layer patterning material film stack disposed on a semiconductor substrate, the patterning material film stack comprising the resist layer and one or more additional layers over which the resist layer is disposed, the metal-containing material comprising metal additives disposed within a resist mixture comprising a resist material and the metal additives, the metal additives being configured and having properties to self-segregate from the resist mixture such that the metal-containing top coat is disposed over the resist layer.

10. The metal-containing material of claim 9 wherein the metal-containing material comprises at least one of a transition metal and a post-transition metal.

11. The metal-containing material of claim 9 wherein the metal-containing material comprises a metal oxide.

12. The metal-containing material of claim 9 wherein the metal-containing material comprises a self-segregating fluorine functionalized metal additive.

13. The metal-containing material of claim 9 wherein the metal additives are configured and adapted to self-segregate from the resist material when subjected to a designated treatment process.

14. The metal-containing material of claim 9 wherein the designated treatment process includes a bake process.

15. The metal-containing material of claim 9 including one or more additional layers of the metal-containing top coat.

16. The metal-containing material of claim 9 wherein the metal-containing top coat comprises properties enabling solubility in a developer solution used in developing a pattern formed in the resist layer.

* * * * *